United States Patent
Casper et al.

[19]

[11] Patent Number: 5,907,166
[45] Date of Patent: May 25, 1999

[54] SINGLE DEPOSITION LAYER METAL DYNAMIC RANDOM ACCESS MEMORY

[75] Inventors: Stephen L. Casper; Timothy J. Allen; D. Mark Durcan; Brian M. Shirley; Howard E. Rhodes, all of Boise, Id.

[73] Assignee: Micron Technology, Inc., Boise, Id.

[21] Appl. No.: 08/852,905

[22] Filed: May 8, 1997

Related U.S. Application Data

[62] Division of application No. 08/516,171, Aug. 17, 1995.

[51] Int. Cl.$^6$ .................. H01L 31/0328; H01L 31/0336; H01L 31/072
[52] U.S. Cl. ......................... 257/202; 257/203; 257/207; 257/666
[58] Field of Search ................................... 257/203, 207, 257/208, 210, 666, 204, 202; 438/123, 199

[56] References Cited

U.S. PATENT DOCUMENTS

| | | | |
|---|---|---|---|
| 3,740,732 | 6/1973 | Frandon | 340/173 |
| 4,314,894 | 2/1982 | Schmelzer et al. | 204/192 |
| 4,862,245 | 8/1989 | Pashby et al. | 357/70 |
| 4,910,866 | 3/1990 | Allen | 29/827 |
| 4,949,161 | 8/1990 | Allen et al. | 357/70 |
| 4,957,878 | 9/1990 | Lowrey et al. | 437/52 |
| 4,958,088 | 9/1990 | Farah-bakhsh et al. | 307/443 |
| 4,989,068 | 1/1991 | Yasuhara et al. | 357/72 |
| 5,021,864 | 6/1991 | Kelly et al. | 357/70 |
| 5,042,011 | 8/1991 | Casper et al. | 365/205 |
| 5,066,999 | 11/1991 | Casper | 357/51 |
| 5,084,406 | 1/1992 | Rhodes et al. | 437/52 |
| 5,131,018 | 7/1992 | McAdams et al. | |
| 5,150,186 | 9/1992 | Pinney et al. | 357/51 |
| 5,155,704 | 10/1992 | Walter et al. | 365/201 |
| 5,159,206 | 10/1992 | Tsay et al. | |
| 5,162,248 | 11/1992 | Dennison et al. | 437/52 |
| 5,220,221 | 6/1993 | Casper | 307/530 |
| 5,270,241 | 12/1993 | Dennison et al. | 437/52 |
| 5,274,276 | 12/1993 | Casper et al. | 307/443 |

(List continued on next page.)

FOREIGN PATENT DOCUMENTS

| | | |
|---|---|---|
| 0317161 | 5/1989 | European Pat. Off. . |
| 0364186 | 4/1990 | European Pat. Off. . |
| 0461313 | 12/1991 | European Pat. Off. . |
| 0487468 | 5/1992 | European Pat. Off. . |
| 3447722 | 7/1985 | Germany . |
| 62-114121 | 5/1987 | Japan ..................................... 360/131 |

OTHER PUBLICATIONS

"Micron Technology, Inc.", *Micron Technology, Inc., specification for DRAM*, 1–16 (1995).
Comerford, R., et al., "Memory catches up", *IEEE Spectrum*, 34–35 (Oct. 1992).
Farmwald, M., et al., "A fast path to one memory", *IEEE Spectrum*, 50–51 (Oct., 1993).
Foss, R., et al., "Fast Interfaces for DRAMS", *IEEE Spectrum*, 54–57 (Oct. 1992).
Gjessing, S., et al., "A RAM link for high speed", *IEEE Spectrum*, 52–53 (Oct. 1992).
Inoue, M., et al., "A 16Mb DRAM with an open BIT–line architecture", *IEEE International Solid–State Circuits Conference*, 246–247.
Jones, F., "A new era of fast dynamic RAMS", *IEEE Spectrum*, 43–49 (Oct. 1992).

*Primary Examiner*—Edward Wojciechowicz
*Assistant Examiner*—S. V. Clark
*Attorney, Agent, or Firm*—Schwegman, Lundberg, Woessner & Kluth, P.A.

[57] ABSTRACT

A 16 megabit ($2^{24}$) or greater density single deposition layer metal Dynamic Random Access Memory (DRAM) part is described which allows for a die that fits within an industry-standard 300 ml wide SOJ (Small Outline J-wing) package or a TSOP (Thin, Small Outline Package) with little or no speed loss over previous double metal deposition layered 16 megabit DRAM designs. This is accomplished using a die architecture which allows for a single metal layer signal path, together with the novel use of a lead frame to remove a substantial portion of the power busing from the die, allowing for a smaller, speed-optimized DRAM. The use of a single deposition layer metal results in lower production costs, and shorter production time.

18 Claims, 15 Drawing Sheets

5,907,166
Page 2

U.S. PATENT DOCUMENTS

| | | | |
|---|---|---|---|
| 5,278,460 | 1/1994 | Casper | 307/296 |
| 5,292,677 | 3/1994 | Dennison | 437/52 |
| 5,293,342 | 3/1994 | Casper et al. | 365/203 |
| 5,295,100 | 3/1994 | Starkweather et al. | 365/189 |
| 5,311,481 | 5/1994 | Casper et al. | 365/230 |
| 5,338,700 | 8/1994 | Dennison et al. | 437/60 |
| 5,340,763 | 8/1994 | Dennison | 437/52 |
| 5,340,765 | 8/1994 | Dennison et al. | 437/52 |
| 5,347,179 | 9/1994 | Casper et al. | 307/451 |
| 5,351,213 | 9/1994 | Nakashima . | |
| 5,352,945 | 10/1994 | Casper et al. | 307/603 |
| 5,357,172 | 10/1994 | Lee et al. | 315/167 |
| 5,361,002 | 11/1994 | Casper et al. | 327/530 |
| 5,362,666 | 11/1994 | Dennison | 437/52 |
| 5,367,213 | 11/1994 | Casper | 327/56 |
| 5,369,317 | 11/1994 | Casper et al. | 326/87 |
| 5,373,470 | 12/1994 | Jones et al. . | |
| 5,394,172 | 2/1995 | Mclaury | 345/200 |
| 5,445,707 | 8/1995 | Toyama et al. | 216/22 |
| 5,446,410 | 8/1995 | Nakakura | 327/565 |
| 5,527,663 | 6/1996 | Togawa et al. | 430/320 |
| 5,587,607 | 12/1996 | Yasuda et al. . | |
| 5,625,221 | 4/1997 | Kim et al. . | |

OTHER PUBLICATIONS

Ng, R., "Fast computer memories", *IEEE Spectrum*, 36–39 (Oct. 1992).

Pinkham, R., et al., "A 128K×8 70MHz Video Ram with Auto Register Reload", *IEEE International Solid–State Circuits Conference*, 236–237 (Feb. 19, 1988).

Salters, R.H., "Fast DRAMS for sharper TV", *IEEE Spectrum*, 40–42, (Oct. 1992).

Yamada, K., et al., "A CPU Chip–On–Board", *IEEE*, pp. 8–11, (Jan. 6, 1993)

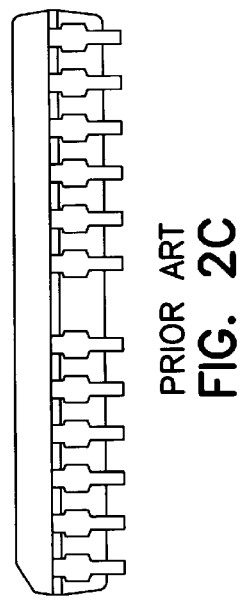
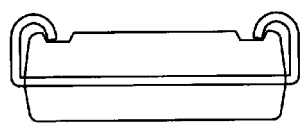
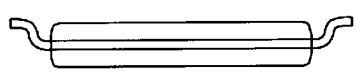
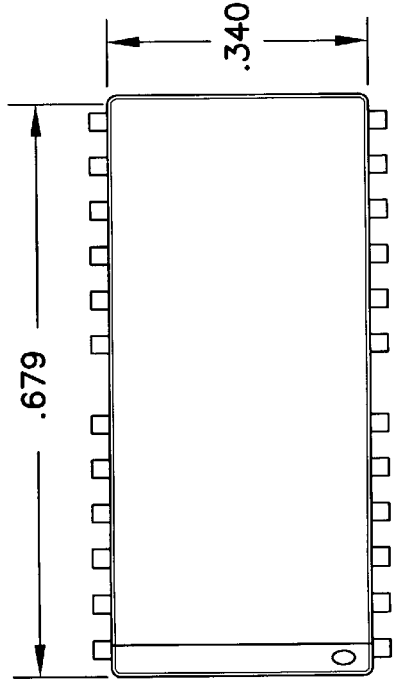
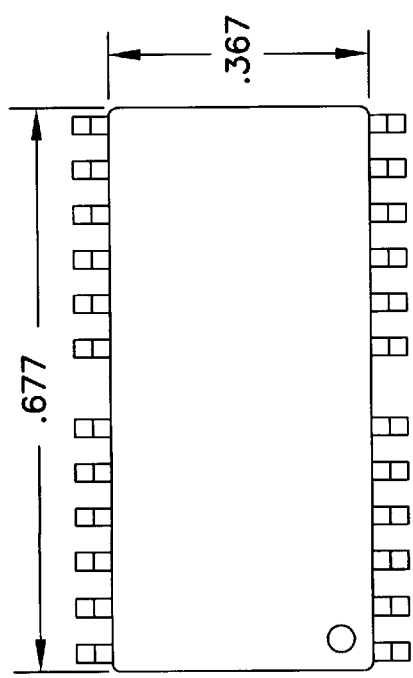

SINGLE DEPOSITION LAYER METAL DYNAMIC RANDOM ACCESS MEMORY

This application is a Divisional of Ser. No. 08/516,171 filed Aug. 17, 1995.

FIELD OF THE INVENTION

The present invention pertains generally to integrated circuit memory design, and in particular to dynamic random access memory design.

BACKGROUND OF THE INVENTION

Dynamic Random Access Memory (DRAM devices are the most widely used type of memory device. The amount of single-bit addressable memory locations within each DRAM is increasing as the need for greater memory part densities increases. This demand for greater memory densities has created a global market and has resulted in memory part standards in which many memory parts are regarded as fungibile items. Thus, many memory parts operate according to well known and universally adopted specifications such that one manufacturer's memory part is plug-compatible with another manufacturer's memory part.

There is a need in the art to produce memory parts which can fit within the packaging requirements of previous generations of memory parts. This need for "plug-compatible upgrades" requires that memory density upgrades are easy to effect in existing computer systems and other systems which use memory, such as video systems. This requires that greater density memory parts be placed within the same size packages as previous generations of memory parts within the same signal and power pinout assignments.

There is a further need in the art to more efficiently manufacture CMOS dynamic random access semiconductor memory parts which utilize space-saving techniques to fit the most memory cells within a fixed die size using a single deposition layer of highly conductive interconnect. There is a need in the art to manufacture such memory parts in a shorter production time using fewer process steps to produce more competitively priced memory parts.

SUMMARY OF THE INVENTION

The present invention solves the above-mentioned needs in the art and other needs which will be understood by those skilled in the art upon reading and understanding the present specification. The present invention includes a memory having at least 16 megabits ($2^{24}$ bits) which is uniquely formed in which highly conductive interconnects (such as metal) are deposited in a single deposition step. The invention is described in reference to an exemplary embodiment of a 16 megabit Dynamic Random Access Memory in which only a single deposition layer of highly conductive interconnects are deposited in a single deposition step. The resulting semiconductor die or chip fits within an existing industry-standard 300 mil SOJ (Small Outline J-wing), TSOP (Thin, Small Outline Package) or other industry standard packages with little or no speed loss over previous double metal deposition layered 16 megabit DRAM physical architectures. This is accomplished using a die orientation that allows for a fast single metal speed path, together with the novel use of a lead frame to remove a substantial portion of the power busing from the single deposition layer metal, allowing for a smaller speed-optimized DRAM. The use of a single deposition layer metal design results in lower production costs, and shorter production time for a wide variety of memory parts, including but not limited to, DRAM, SRAM, VRAM, SAM, and the like.

BRIEF DESCRIPTION OF THE DRAWINGS

In the drawings, where like numerals refer to like components throughout the several views:

FIGS. 1A, 1B and 1C shows a prior art package for a TSOP (Small, Thin Outline Package) used as an industry standard plug-compatible package for a 16 megabit DRAM die;

FIGS. 2A, 2B and 2C shows a prior art package for a SOJ (Small Outline J-wing) used as an industry standard plug-compatible package for a 16 megabit DRAM die;

DETAILED DESCRIPTION OF THE INVENTION

Figure 3:
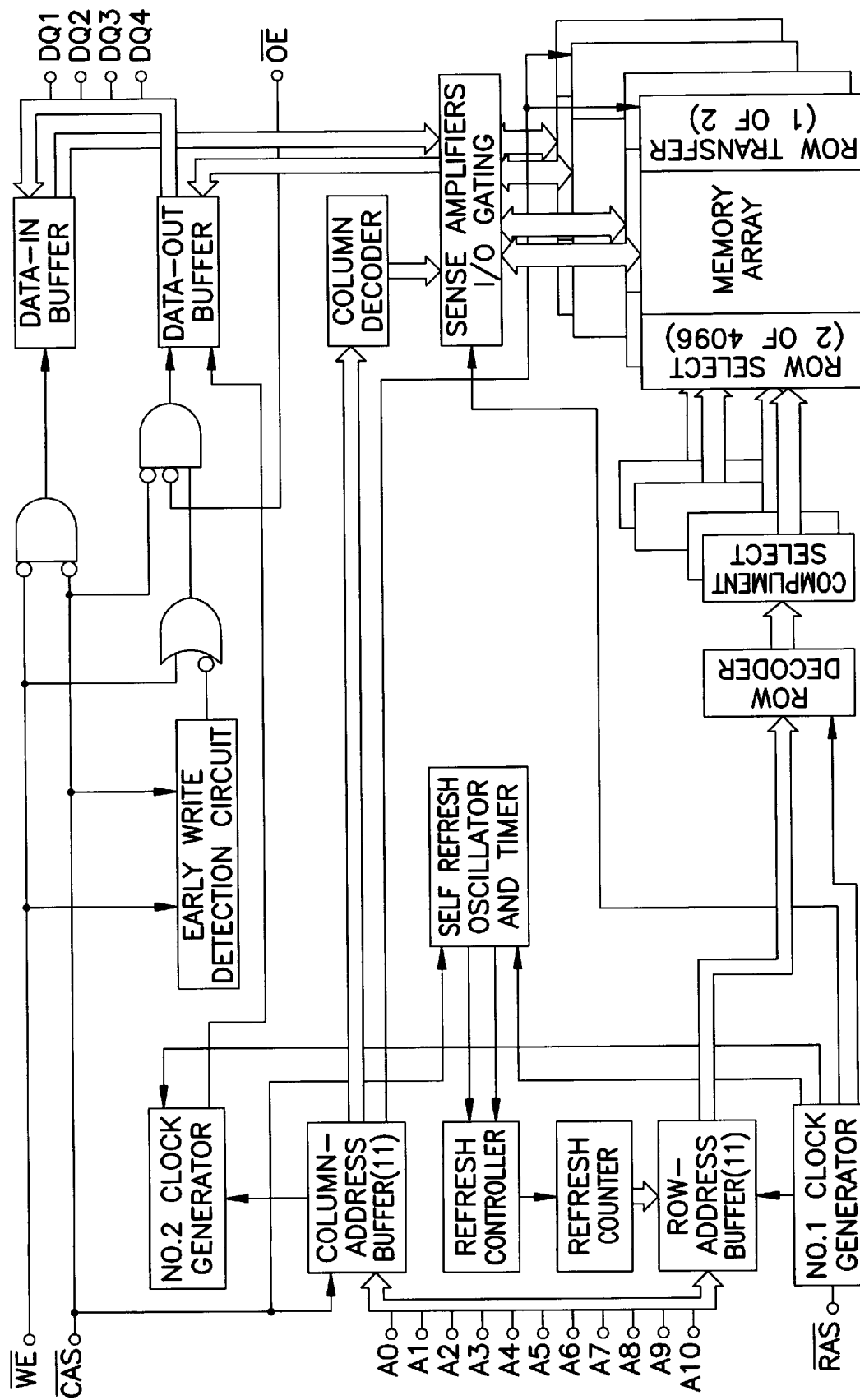
FIG. 3 is a functional block diagram of one configuration of a 16 megabit single deposition layer metal DRAM die.

In the following detailed description of the preferred embodiment, references made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical, physical, architectural, and electrical changes may be made without departing from the spirit and scope of the present invention. The following detailed description is, therefore, not to be taken in a limiting sense, and the scope of the present invention is defined only by the appended claims and their equivalents.

Design Overview

The present invention is directed to a novel design for a memory device in which a plurality of highly conductive interconnects (such as metal) are deposited in a only single deposition step. The present invention is described in an exemplary embodiment as a CMOS Dynamic Random Access Memory (DRAM) memory part having at least a 16 million ($2^{24}$) bit storage capacity fabricated using a single deposition layer metal and having an overall die size manufactured specifically to fit in an industry standard 300 mil wide package. In the preferred embodiment of the present invention, the die size is approximately 210 mils by 440 mils. This memory part includes an improved lead frame within the package for off-chip power distribution, an improved row decoder/driver design using isolation techniques such as grounded gate technology, a new layout for the sense amplifier design utilizing grounded gate isolation, and a new staggered design for the on pitch cell layout to enable greater density and global routing using a single deposition layer of highly conductive interconnect. Confining the use of highly conductive interconnect to one layer deposited in a single process step puts a severe limitation on the design of the memory but through the use of the novel physical architecture and lead frame, the present single deposition layer metal DRAM design is implemented in the same or similar area previously used to implement two or more metal layer DRAM designs.

For the purposes of this disclosure, references to "highly conductive interconnects" shall refer to any interconnect materials having a sheet resistance of less than one ohm per square and includes metal interconnect materials. References to a "single deposition layer metal" shall refer to a mask-defined, highly conductive interconnect layer which is deposited in a single deposition step. Deposition techniques are methods known to those skilled in the semiconductor arts. Some examples of highly conductive interconnects include, but are not limited to, aluminum, tungsten, titanium, titanium nitride, and titanium tungsten.

Additionally, a "semiconductive interconnect" is any interconnect comprising a material having greater than 1 ohm per square sheet resistivity. Some examples of semiconductive interconnect materials and their sheet resistance are presented in TABLE 1, below. Those skilled in the art will readily recognize that other highly conductive interconnect and semiconductive interconnect materials could be utilized without departing from the scope and spirit of the present invention. The above examples are offered for illustration and are not intended to be exclusive or limiting.

TABLE 1

SEMICONDUCTIVE INTERCONNECT MATERIALS

| MATERIAL | SHEET RESISTANCE (ohms/square) |
| --- | --- |
| n+ diffusion | 75 |
| p+ diffusion | 75 |
| n− diffusion | 4000 |
| unstrapped polysilicon | 200 |
| tungsten silicide strapped polysilicon | 6 |

Industry Standard Packaging

FIGS. 1A, 1B, 1C show the mechanical outlines of a typical Thin, Small Outline Package (TSOP) and FIGS. 2A, 2B and 2C show an industry standard small outline J-wing (SOJ), respectfully. These industry standard packages are typically 340 to 370 mils wide by approximately 675 mils long, with variable thickness and conform to JEDEC standards number R-PDSO-J. Two or more metal layer 16 megabit ($2^{24}$ Mb) Dynamic Random Access Memory (DRAM) chips fit within cavities of these packages. The DRAM chips of the prior art which are designed for these packages are manufactured using a process which requires at least two layers of metal to interconnect various components on the semiconductor die. For example, in the CMOS silicon gate process, a 4 Mb by 4 bit DRAM configuration (16,777,216 total addressable memory locations) is manufactured by Micron Semiconductor Inc., the assignee of the present invention, as part no. MT4C4M4B1 (See page 2–53 of the 1995 *Micron DRAM Data Book* published and distributed by Micron Technology, Inc., the assignee of the present invention, which is hereby incorporated by reference). This part is available in SOJ and TSOP package outlines having standard operating parameters and is viewed as a fungible commodity in a market for semiconductor memories. Those skilled in the art will readily recognize that a wide variety of standard 16 megabit DRAM configurations and pinouts are available within the industry, such as 2 Mb by 8 bit, 16 Mb by 1 bit, and other configurations such as are used in video RAMs.

FIG. 3 is a functional block diagram of a typical memory configuration for the single deposition layer metal 16 Mb DRAM in a 4 Mb by 4 bit configuration. The present invention can be configured to operate according to this functional block diagram. Those skilled in the art will readily recognize that different functional configurations may be implemented using the physical architecture and the single deposition layer metal technology of the present invention. The 4 Mb by 4 bit configuration of FIG. 3 is illustrative only and the present invention is not so limited. The implementation of memory parts using the present invention allows the production of a 16 megabit single deposition layer metal DRAM which operates identically to and is plug compatible with the other 16 megabit DRAMs available in the 300 ml wide SOJ and TSOP package outlines. Transparent to the consumer, however, is the fact that this art is produced more economically.

The memory shown in the functional block diagram of FIG. 3 operates according to well known principals. The eleven address lines shown to the left of FIG. 3 are clocked into the ROW ADDRESS BUFFER by the signal RAS (row address strobe) to select the row in the memory array to be read or written. At a later time, the same eleven address lines are clocked into the COLUMN ADDRESS BUFFER by the signal CAS (column address strobe) to select the column in the memory array to be read or written. The data lines shown on the right of FIG. 3 are bidirectional data ports used for both reading and writing data. Not shown in FIG. 3 (since it is usually transparent to the end user) is the circuitry for controlling the spare memory cell areas and the fuses used to substituted good memory cell areas for areas found to be defective after manufacture. This circuitry is used only for the repair of memory chips after manufacture but before delivery to the customer.

16 Megabit Single Deposition Layer Metal DRAM Architecture

Figure 4:
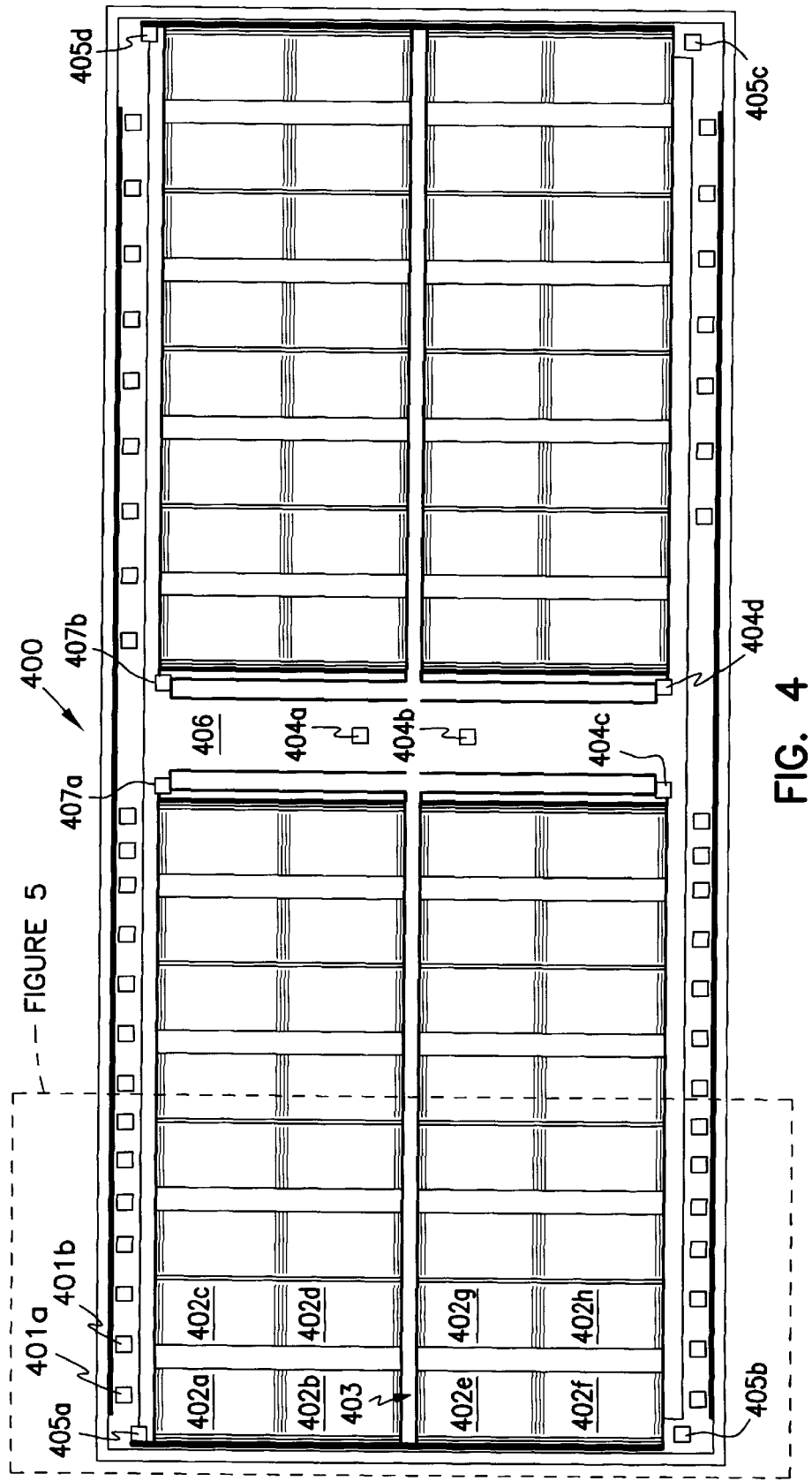
FIG. 4 is a physical layout view of the entire die surface of a 16 megabit single deposition layer metal DRAM die.

The physical architecture of the present invention is shown in block diagram form in FIG. 4. The overall semiconductor die 400 is approximately 210 mils wide by 440 mils long with signal bonding pads 401a, 401b, 401c, etc. shown on the longitudinal edges of the semiconductor die. The power for the semiconductor die is also available through peripheral bonding pads 405a, 405b, 405c, etc. on the longitudinal edges and also through interior bonding pads 404a, 404b, 404c, etc. found in the interior portions of the die. In order to achieve the single metal deposition design, a portion of the power busing to the circuitry on the semiconductor die is performed offchip through the use of a novel lead frame in which some power distribution to the interior portions of the chip is accomplished through the lead frame. Power is brought to the interior regions of the die through the interior bonding pads 404a, 404b, 404c, etc. by wire bonding from this unique lead frame which is positioned over the top of the die. The lead frame is described more fully below.

Referring once again to FIG. 4, the 16 Mb DRAM physical architecture has the memory cells and active support circuitry divided into four quadrants, with I/O path areas 403 and 406 between the quadrants. Each quadrant contains 4 Mb of memory cell area with each quadrant divided into 16 subarrays of 256 kilobits ($2^{18}$ bits) of single bit memory cells (where 1 Kb=1024 bits). Each 256 Kb cell subarray is serviced by row decoders, column decoders, and sense amplifiers which are collectively referred to as pitch cells. Pitch cells are the circuits linearly aligned with the memory cells in an array along row and column lines. The pitch cells are so called because the cells are said to be on the same pitch as the line of memory cells serviced by the pitch cells. The layout of these pitch cells is described below in more detail.

Since only a single deposition layer metal is used in the present implementation of the die 400, the operational speed of the cell subarrays is of paramount importance. Signal lines are all highly conductive interconnect lines to provide rapid distribution of the data into or out of the memory arrays. Thus, in one embodiment the digit or bit lines in the memory cell arrays are implemented in highly conductive interconnect material and the word or row lines are implemented in semiconductive material. In an alternate embodiment, the word lines in the memory cell arrays are implemented in a highly conductive interconnect material and the bit lines are implemented in semiconductive material. Those skilled in the art will readily recognize that a wide variety of highly conductive materials may be used in the implementation of the present invention such as metals including titanium, aluminum, tungsten, titanium nitride, titanium tungsten, etc. deposited using vapor deposition or other known techniques. The aforementioned list of selected metal types is illustrative only and not intended to be limiting.

Since the use of the highly conductive interconnect is limited to one deposition step, more of the pitch cell interconnect is implemented in diffusion layers and polysilicon which is necessarily a slower signal path than metal due to the increased resistance and capacitance of such an interconnect. To minimize the need for long run lengths of interconnect, the memory cell areas are subdivided into small regions. With more subdivisions of cell area, more pitch cells are required to service those cell areas. But within the global restriction of a die size remaining approximately the same size as the prior art multiple metal layer DRAM parts, the size of the cell areas in the present invention is reduced and the pitch cells are closely spaced and staggered to conserve space.

Figure 5:
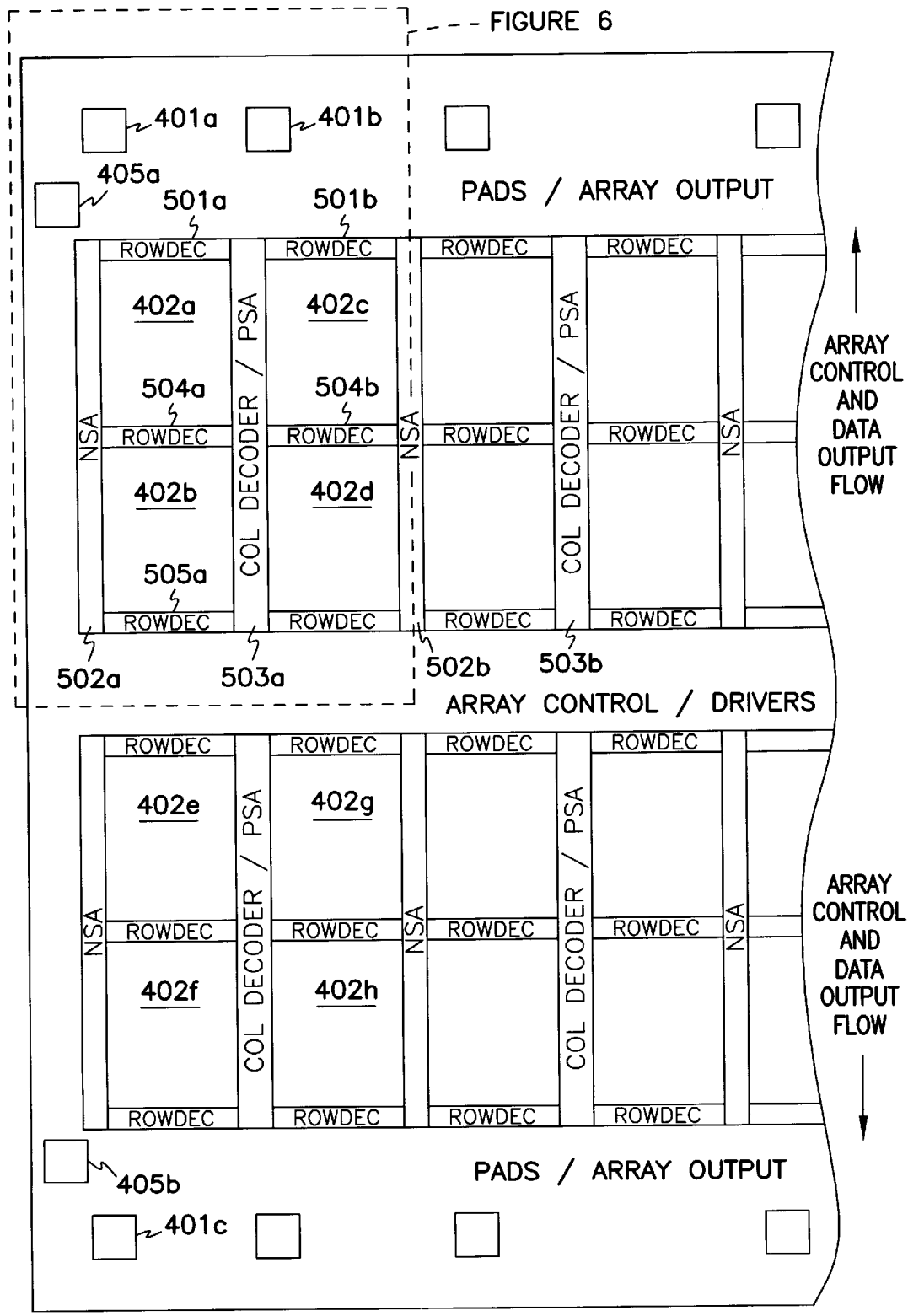
FIG. 5 is a detailed portion of the physical layout view of the 16 megabit single deposition layer metal DRAM die of FIG. 4.

Referring to FIG. 5, an expanded view of a portion of memory cell area and active support circuit area of FIG. 4 is shown. FIG. 5 shows several 256 Kb subarrays 402a, 402b, 402c, 402d, etc. of memory cells from the upper left quadrant of the semiconductor die of FIG. 4 and several 256 Kb subarrays 402e, 402f, 402g, 402h, etc. of memory cells from the lower left quadrant of the semiconductor die of FIG. 4. The novel architecture shown in FIGS. 4 and 5 is specifically designed to minimize read and write times between the input and output (I/O) pins for accessing the memory cells in the array. Although a long lead length may be required between an input bonding pad and an actual cell being addressed, the data line to the output bonding pad would be quite short. In a complementary fashion, a memory cell which has a short physical connection to the input address bonding pads may have a long data path to the output data line. In this fashion, the overall access time of any one cell in the array is averaged to be 70 nanoseconds or less.

Figure 7:
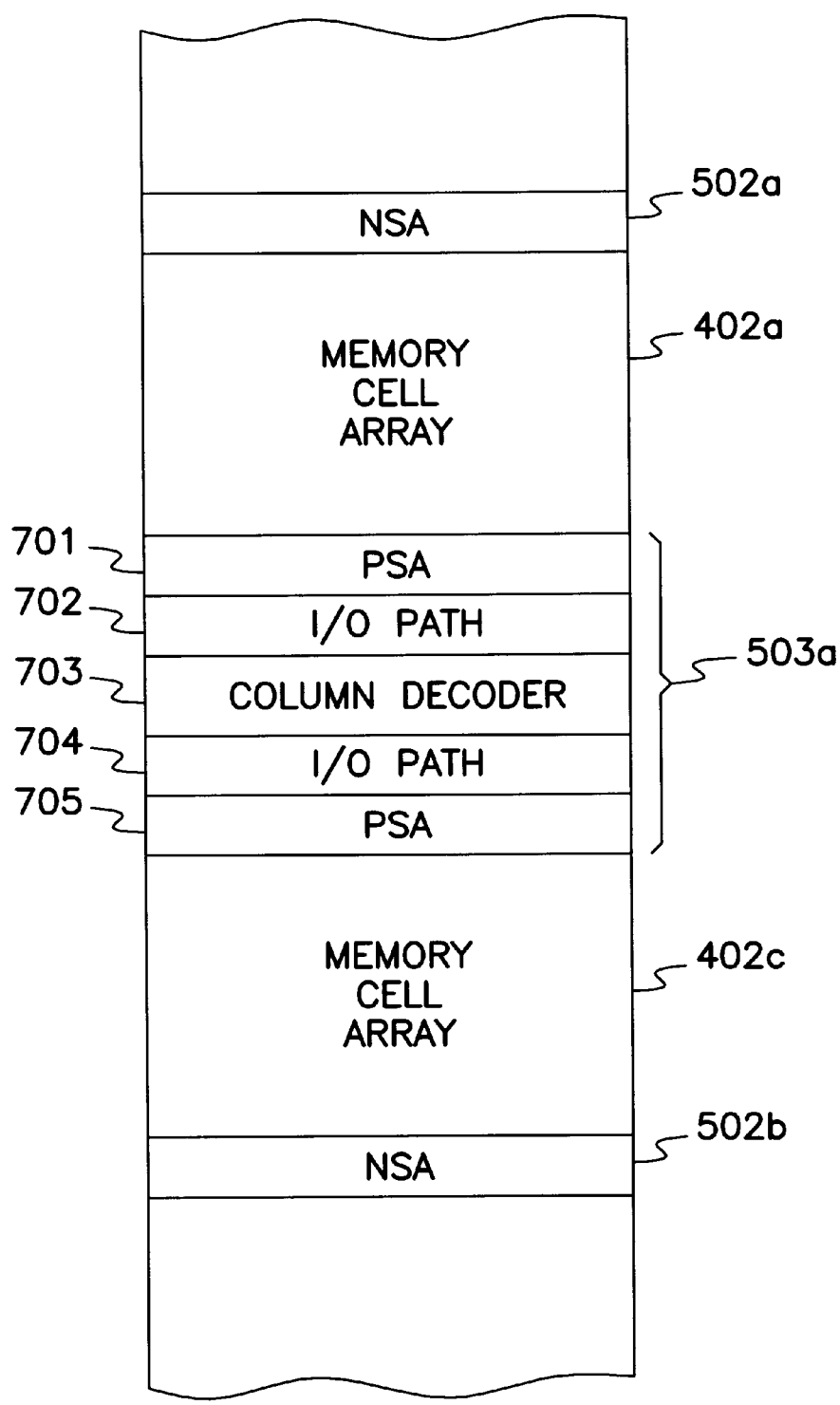
FIG. 7 is a detailed cross section of the physical layout view of the 16 megabit single deposition layer metal DRAM die of FIG. 5, showing placement of the memory cell arrays, I/O paths, p-sense amplifiers, n-sense amplifiers and column decoder circuitry.

The 256 Kb subarrays of memory cells are arranged as 512 bits by 512 bits in an array. The subarrays are serviced by n-sense amplifiers (NSA) 502a and p-sense amplifiers (PSA) shown in the vertical rectangles in FIG. 5. The column address decoders (COL DECODER) for the memory subarrays are colocated with the p-sense amplifiers in the vertical rectangular areas 503a. The placement of the column address decoders and the p-sense amplifiers is shown in further detail in FIG. 7 in which, due to the orientation of FIG. 7, the n-sense amplifiers (NSA) 102, memory cell array 402b, the p-sense amplifiers (PSA) and the column address decoders 503a for the memory subarrays appear in a horizontal stack. The common area 503a in FIG. 7 shows in more detail the location of the PSA area 701, the I/O path area 702, the column decoder area 703, more I/O area 704 and another PSA area 705. The specific layout of these areas is described more fully below.

Referring once again to FIG. 5, the row address decoders (ROWDEC) are located in the horizontal areas 501a, 504a, 505a, etc. between the memory subarrays. For the subarray in the upper half of FIG. 5, the array control and output data flow toward the upper portion of the die and for the subarray in the lower half of FIG. 5, the array control and output data flow toward the lower portion of the die.

Figure 6:
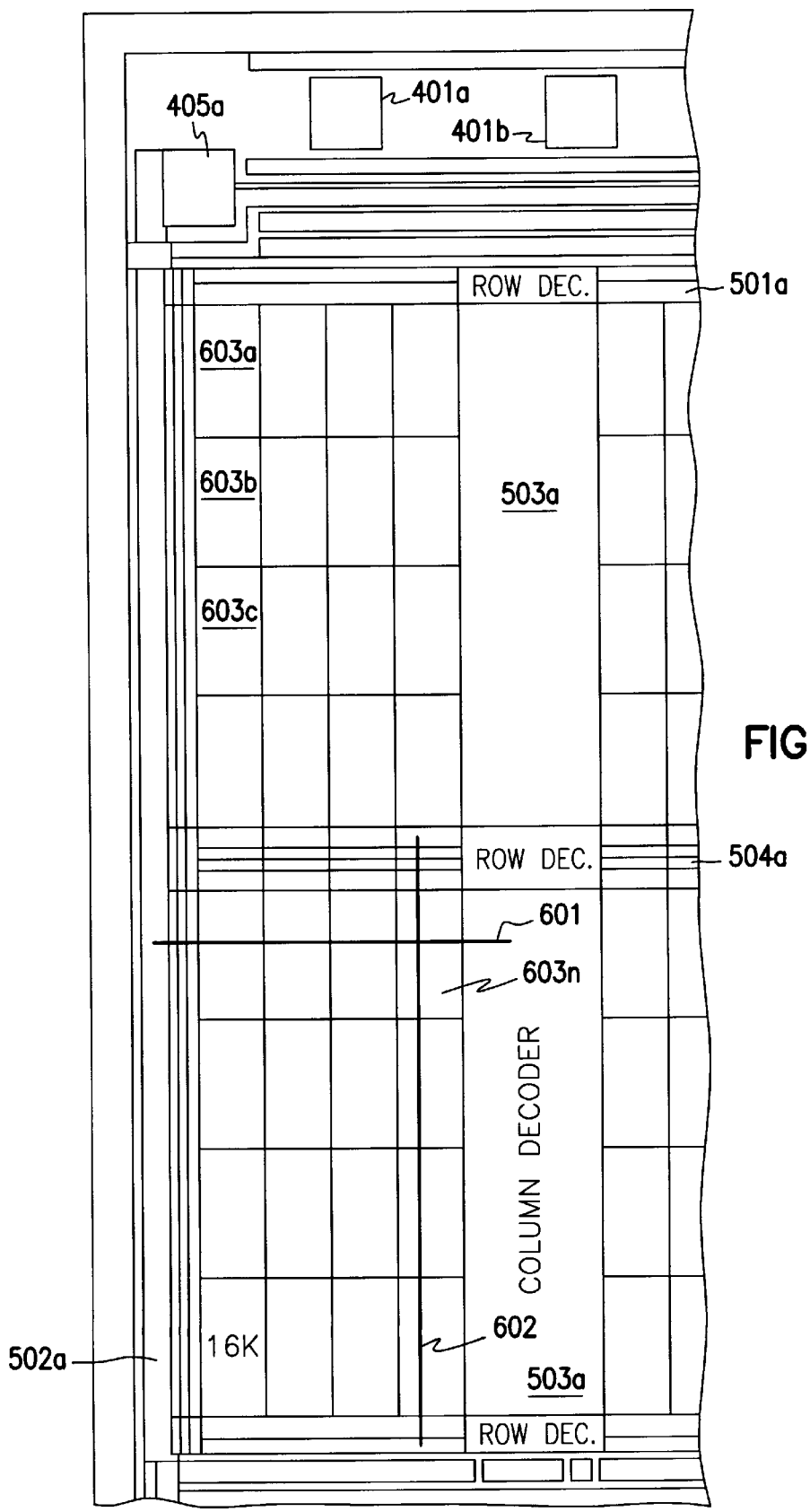
FIG. 6 is an even more detailed portion of the physical layout view of the 16 megabit single deposition layer metal DRAM die of FIG. 5.

FIG. 6 shows the subarrays further divided into 16K blocks 603a, 603b, 603c, etc. of memory cell areas arranged as 128 bits by 128 bits. In one embodiment, the bit or digit lines 601 across the memory cell blocks are implemented in highly conductive interconnect material (such as metal) and connect the memory cell areas 603n to the column decoders. In this embodiment, the word lines 602 across the memory cell blocks 603n are polysilicon connecting the memory cells to the row decoders. The data paths to and from the cell areas are connected to the peripheral signal bonding pads by routing the data paths in areas 503a toward the die periphery located toward the top left of FIG. 6. Those skilled in the art will readily recognize that the word lines 602 across the memory cell blocks may also be implemented using conductively strapped polysilicon to connect the memory cells to the row decoders.

In an alternate embodiment, the digit lines 601 are implemented in polysilicon or conductively strapped polysilicon. In this alternate embodiment, the word lines 602 across the memory cell blocks 603n are implemented in highly conductive interconnect material to connect the memory cells to the row decoders.

As described above, row drivers, row decoders, column decoders, and sense amplifiers are collectively referred to as pitch cells. The pitch cells are so called because the cells are said to be on the same pitch as the line of memory cells serviced by the pitch cells. Since the pitch cell areas of the DRAM of the present invention make up roughly 15% of the die area, the pitch cells are kept as small and narrow as possible. The memory cells are very small in relation to the pitch cell size so the pitch cells are staggered and closely spaced to allow the pitch cells to stay on pitch. Since the row decoders drive the word lines with a slightly elevated voltage to write the memory cells with a slightly higher voltage to ensure maximum capacitor charge voltage, the transistors of the row decoders must be fortified to prevent overvoltage punch-though. Field implant, which is typically used only for isolation, is used in the transistors of the row decoders to improve the resistance to punch-though. Also, to properly isolate the transistors in the column decoders from their neighbors, grounded gate isolation over field oxidation is used, as described below in conjunction with FIGS. 13 and 15 below.

Power and Signal Distribution

The $V_{cc}$ (power) and $V_{ss}$ (ground) connections to the circuitry of the die 400 require metal connections from the bonding pads to the circuits. The restriction of using a single deposition layer metal of interconnect and the restriction in the die size require that at least some of the power distribution be performed off-chip. This is accomplished by placing some power bonding pads in the interior regions of the die 400 and using a novel lead frame shown in block diagram form in FIG. 8. The mechanical layout of the lead frame is shown in FIG. 9.

In the prior art packages shown in FIGS. 1A and 2A, the power and ground pins are located along the longitudinal edges of the chip. In prior art multiple metal layer DRAM designs, the power is brought to the interior of the die by on-chip metal interconnects connecting the peripheral power bonding pads to the on-chip power buses for distribution. This required that the $V_{cc}$ (power) and $V_{ss}$ (ground) buses have their metal interconnect paths go over or under one another on the die. In the present invention, the lead frame of FIGS. 8 and 9 allows the $V_{cc}$ and $V_{ss}$ to be distributed from within the interior regions of the die without the need for on-chip power buses to go over or under one another.

Figure 8:
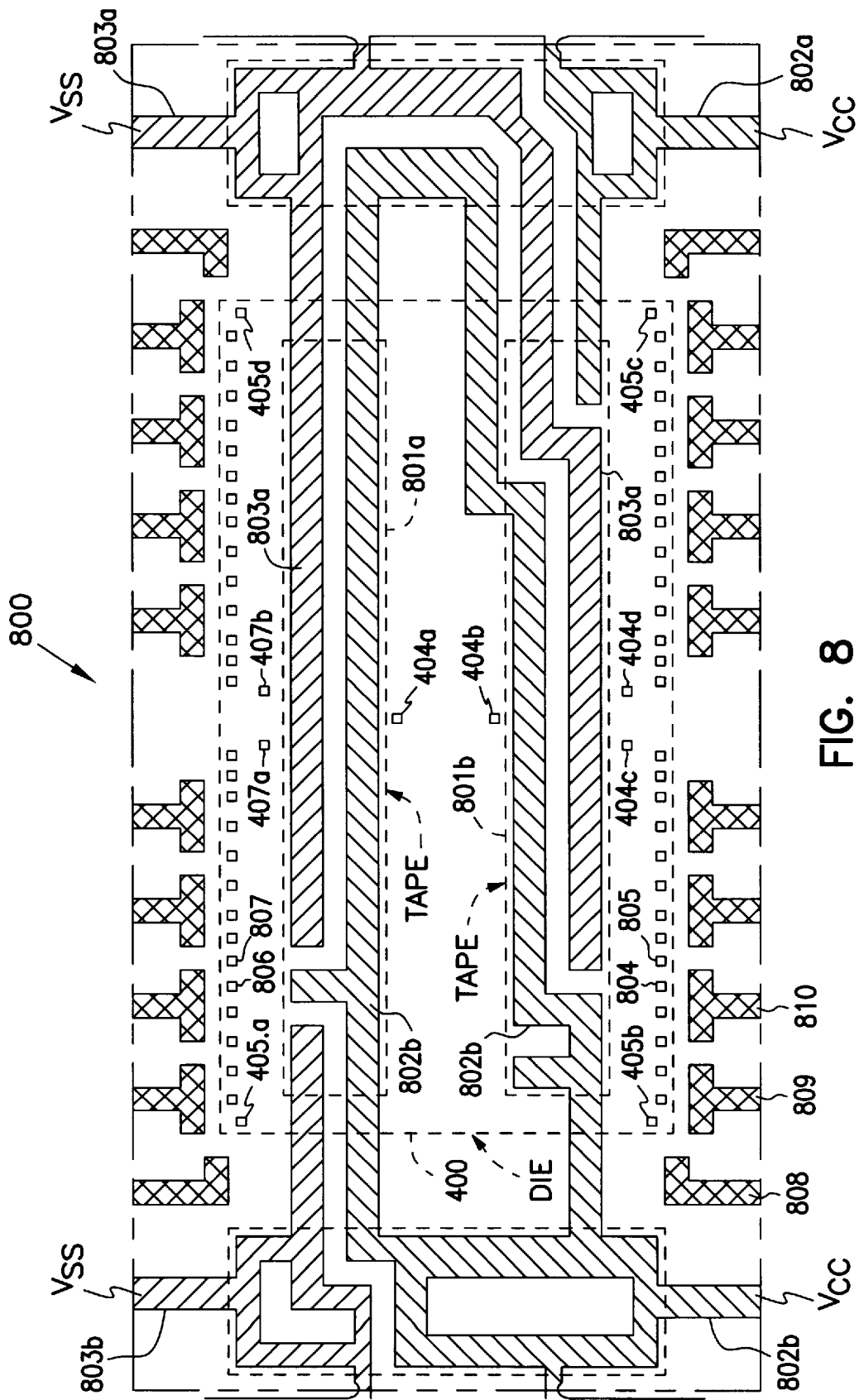
FIG. 8 is a block diagram of the lead frame used for the 16 megabit single deposition layer metal DRAM die of FIG. 4.
Figure 9:
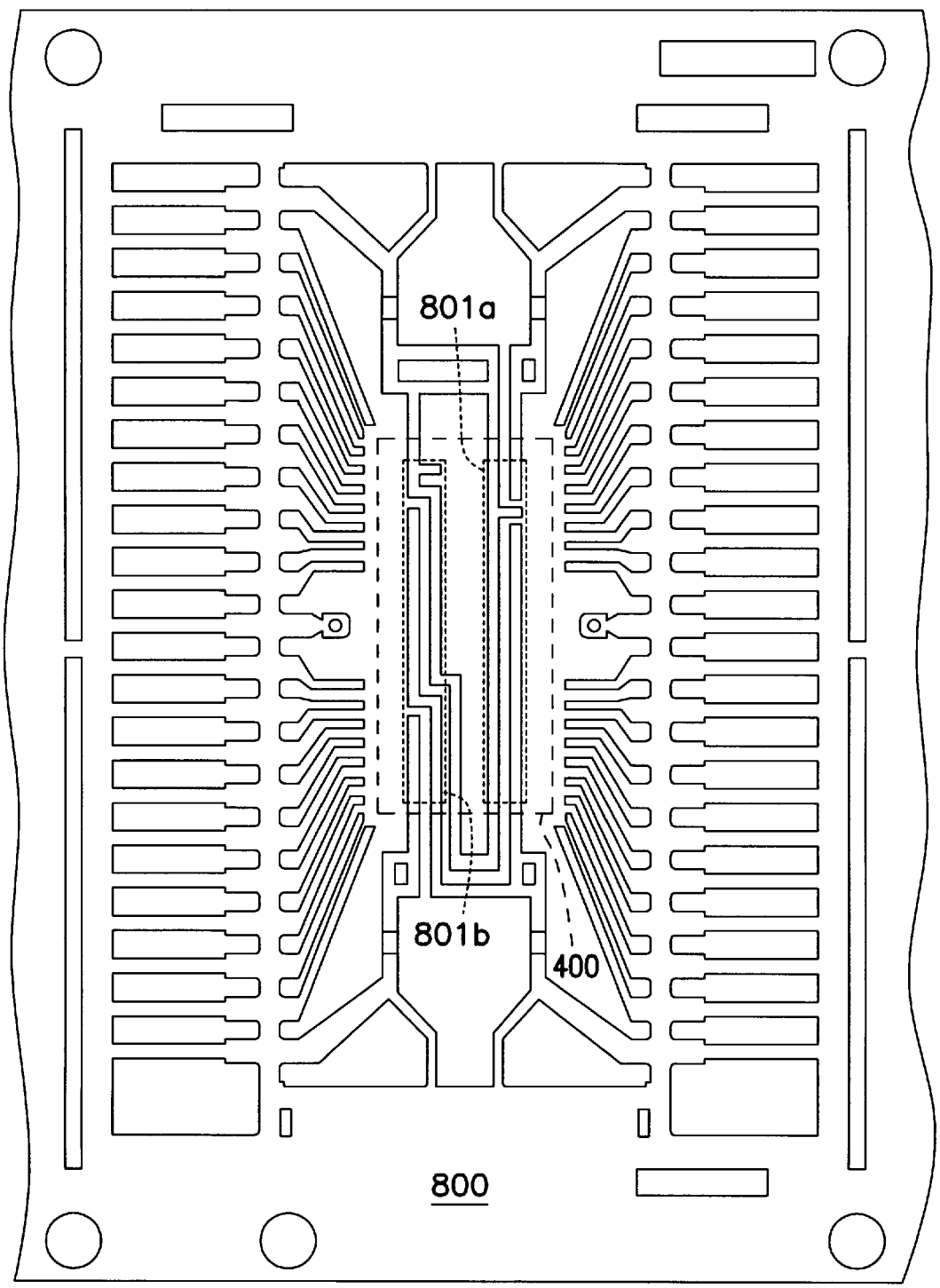
FIG. 9 is a mechanical diagram of the lead frame used for the 16 megabit single deposition layer metal DRAM die of FIG. 4.

The lead frame shown in FIG. 8 can be overlaid onto the die architecture layout of FIG. 4 to show the arrangement of the lead frame over the power bonding pads of the die. In FIG. 8, dashed outline 400 indicates the location of the die of FIG. 4 beneath the lead frame. The $V_{cc}$ (power) buses are identified with reference numbers 802a and 802b. The $V_{ss}$ (ground) buses are identified with reference numbers 803a and 803b. The lead frame buses 802a, 802b, 803a and 803b are insulated from touching the top of the die by a polyimnide die coat and two insulating tape strips 801a and 801b. The primary finction of the insulating tape 801a and 801b is to provide a mechanical backing for the metal traces of the lead frame. Since power buses 802a, 802b for $V_{cc}$ and the ground buses 803a and 803b for $V_{ss}$ are located over the top of the interior portions of die 400, the buses are wire bonded to the interior bonding pads 404a, 404b, 404c, etc., to complete the power and ground distribution.

The block diagram of the lead frame in FIG. 8 also shows a portion of each package lead as a cross hatch metal lead 808, 809, etc. There are more bonding pads indicated on the die than pins on the package since multiple wire bonds are made from bonding pads to the leads frame for I/O signals.

The pin out shown for FIG. 8 is plug compatible with existing memory parts. For example, lead frame pin 808 would correspond to pin DQ1 (in/out data line number one), which is pin number 2 in the 24/26 pin SOJ and the 24/26 TSOP packages for part no. MT4C4M4B1 available from Micron Technology, Inc., the assignee of the present invention. In this part, $V_{cc}$ power bus 802b is a part of pin 1 and $V_{ss}$ ground bus 803b is a part of pin 26.

Figure 10:
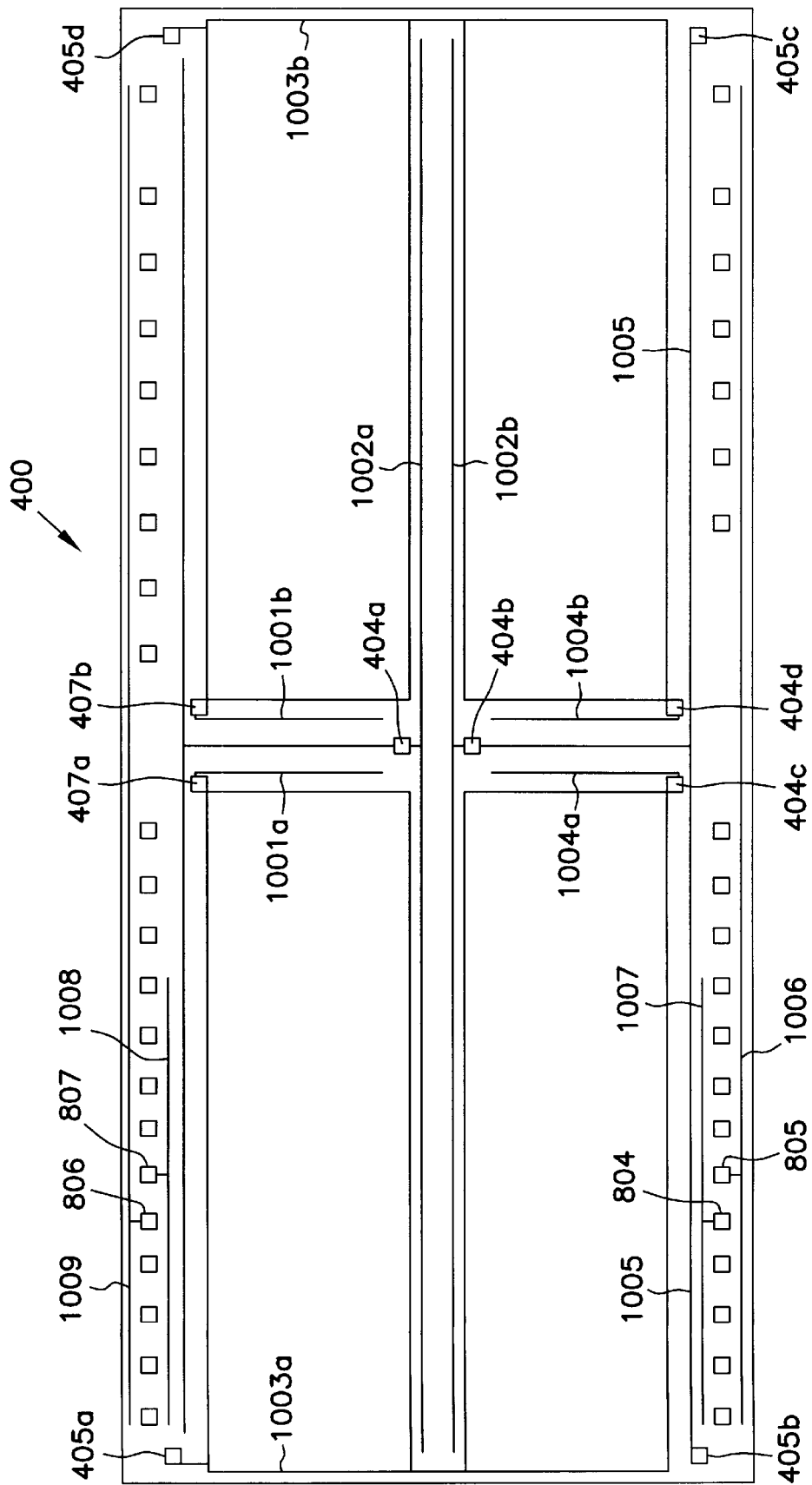
FIG. 10 is a diagram showing only the power bussing architecture for the 16 megabit single deposition layer metal DRAM of FIG. 4.

FIG. 10 shows the on-chip power bussing architecture which relies upon the off-chip power bussing of the lead frame to complete the power and ground distribution. Power and ground distribution generally requires substantially larger traces than signal interconnects. The lead frame provides power distribution across the die to reduce consumption of the highly conductive interconnect layer for power distribution. A lead frame design must also distribute the power over the extent of the die without large ohmic losses to prevent unnecessary thermal dissipation and voltage gradients across the circuits on the die. The power bonding pads shown in FIG. 10 correspond to the power bonding pads shown and described in conjunction with FIGS. 8 and 4.

In FIG. 10, bonding pads 404a and 404b are wire bonded to the power bus 802a of lead frame 800 of FIG. 8 to distribute $V_{cc}$ to the interior areas of the die 400 along on-chip busses 1002a and 1002b, respectively. The bonding pads 404c and 404d of FIG. 10 are wire bonded to ground bus 803a of lead frame 800 of FIG. 8 to distribute $V_{ss}$ to the interior areas of the die 400 along on-chip busses 1004a and 1004b,respectively. The bonding pads 407a and 407b of FIG. 10 are also wire bonded to ground bus 803a of lead frame 800 of FIG. 8 to distribute $V_{ss}$ to the interior areas of the die 400 along on-chip busses 1001a and 1001b, respectively.

Corner bonding pads 405a is wire bonded to the ground bus 803b of lead frame 800 of FIG. 8 to distribute $V_{ss}$ to the interior areas of the die 400 along on-chip buss 1003a which is also connected to bonding pads 407a and 404c and busses 1001a and 1004a. Corner bonding pad 405d is wire bonded to the ground bus 803a of lead frame 800 of FIG. 8 to also distribute $V_{ss}$ to the interior areas of the die 400 along on-chip buss 1003b which is also connected to bonding pads 407b and 404d and busses 1001b and 1004b.

Corner bonding pad 405b is wire bonded to the power bus 802b of lead frame 800 of FIG. 8 to distribute $V_{cc}$ to the interior areas of the die 400 along on-chip buss 1005 which is also connected to bonding pad 404b and corner bonding pad 405c. Corner bonding pad 405c is wire bonded to the power bus 802a of lead frame 800 of FIG. 8 to distribute $V_{cc}$ to the interior areas of the die 400 along on-chip buss 1005 which is also connected to bonding pads 404b and corner bonding pad 405b.

There are additional power and ground bonding pads to supply power and ground to the output drivers along the top left edge and the bottom left edge of the die shown in FIG. 10. Bonding pad 804 is wire bonded to power bus 802b of lead frame 800 of FIG. 8 to distribute $V_{cc}$ to the output driver areas of the die 400 along on-chip bus 1007. Bonding pad 807 is wire bonded to power bus 802b of lead frame 800 of FIG. 8 to distribute $V_{cc}$ to the output driver areas of the die 400 along on-chip bus 1008. Bonding pad 805 is wire bonded to power bus 803a of lead frame 800 of FIG. 8 to distribute $V_{ss}$ to the output driver areas of the die 400 along on-chip bus 1006. Bonding pad 806 is wire bonded to power bus 803b of lead frame 800 of FIG. 8 to distribute Vss to the output driver areas of the die 400 along on-chip bus 1009.

Single Deposition Layer Metal and Semiconductive Interconnects

In general, the preferred embodiment to the present invention is implemented using a submicron process in a dense packing architecture using a single deposition layer metal. Interconnects to the pitch cells are shared between the single deposition layer metal and semiconductive interconnects. Those skilled in the art will readily recognize that several semiconductive interconnects could be incorporated into the design. For example, in one embodiment, conductivity of semiconductive interconnects is improved by strapping the polysilicon with a refractory metal (such as tungsten or titanium) using a vapor deposition process and annealing the metal to the polysilicon. This is done as a separate step to the highly conductive interconnect deposition. Additionally, a Salicide (self-aligned silicide) process may be used to selectively place a silicide on specific active areas.

In order to obtain interconnect efficiency the n-sense amplifiers, p-sense amplifiers, and row decoders and drivers are placed on pitch with the memory cell array. On-pitch interconnects are a much more efficient usage of the single deposition layer metal than off pitch interconnects, since on-pitch interconnects are less likely to overlap and require semiconductive interconnects to complete a circuit. The pitch cells are necessarily larger in width than the memory cells so the pitch cells are staggered to enable the wider pitch cells to stay on pitch with the memory cells. The pitch cells are constructed to be narrow which, in the case of a row driver pitch cell, requires that the row driver transistors be especially immune to failure due to the increase voltage they are required to source. A novel row driver design is described below which provides staggered on-pitch layout using isolation circuits to eliminate punch through and channel leakage current effects.

The preferred embodiment to the present invention incorporates n-sense and p-sense amplifiers for reading cells and refreshing cells. Referring once again to FIG. 7, the block diagram shows a detailed enlargement of the column decoder/PSA 503a of FIG. 5. In one embodiment of the present design, n-sense amplifiers 502a, 502b are shared between adjacent memory cell arrays 402a and 402c, and dual p-sense amplifiers 701 and 705 service memory cell arrays 402a and 402c, respectively. In this embodiment, column decoder 703 is situated between I/O paths 702 and 704. I/O paths 702 and 704 are the pathways for data to the data pins after proper row and column selection performing row access strobe (RAS) and column access strobe (CAS) commands to access a particular word of the memory.

Figure 11:
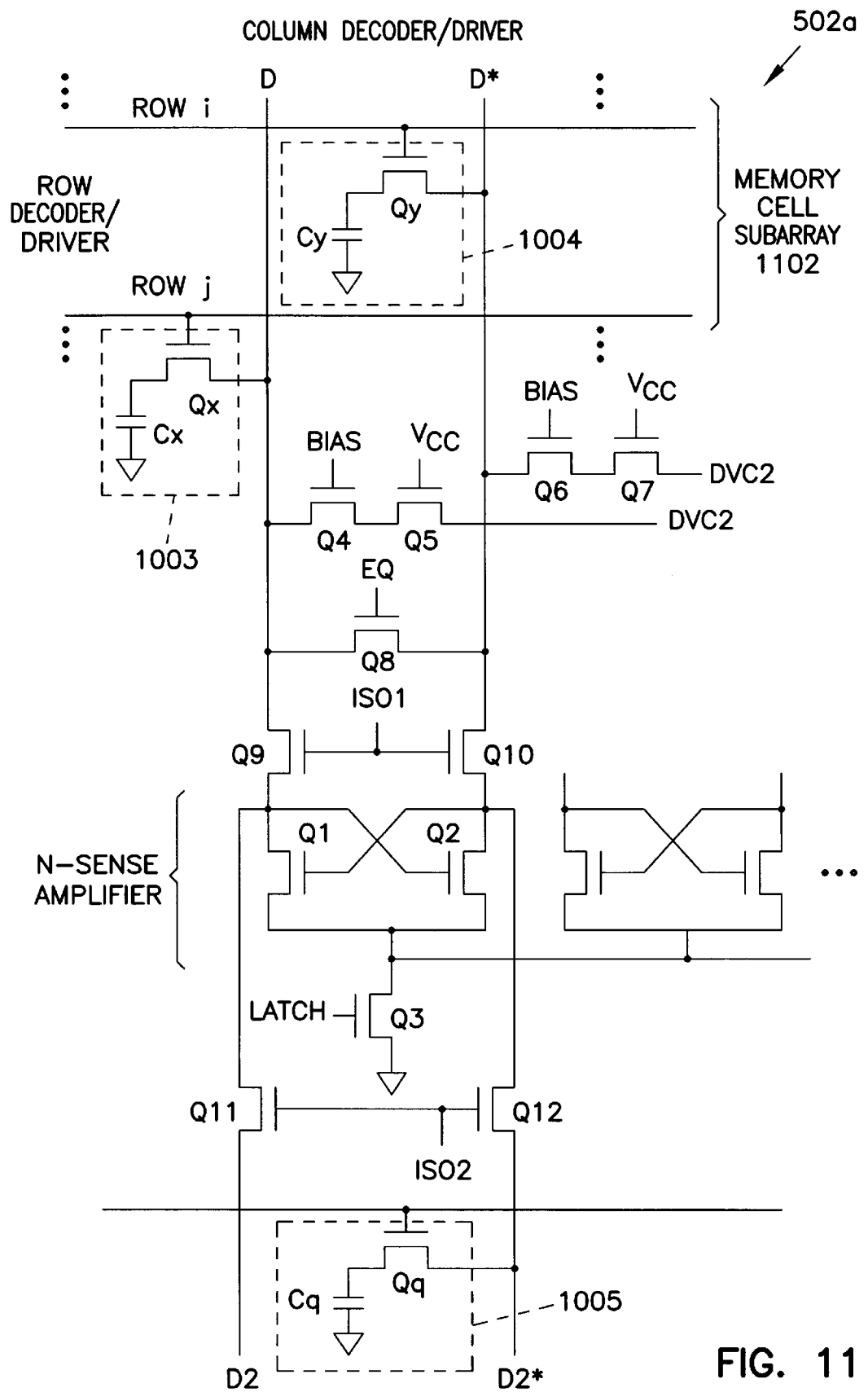
FIG. 11 is an electrical schematic diagram of the n-sense amplifiers, including precharge, equalization, and isolation circuitry.

FIG. 11 shows a schematic diagram of one configuration of an n-sense amplifier and related circuitry. In this configuration, a memory cell subarray 1102 is connected to an array of n-sense amplifiers for both reading the state of the memory cells and refreshing each cell as it is read. The n-sense amplifier comprises two cross coupled n-channel enhancement mode field effect transistors Q1 and Q2, a latch transistor Q3, and bias network transistors Q4, Q5, Q6, and Q7. Digit lines D and D* are adjacent digit line pairs which are connected to cell x 1003 and cell y 1004, respectively. The row decoding and column decoding hardware is designed such that any single memory, access activates either D or D*, but never both at the same time. For example, there is no memory access which would read or refresh both cell x 1003 and cell y 1004 at the same time since the present architecture is a folded bit line system. This allows the active use of only one digit line of the pair per access and allows the other digit line of the pair to be used as a voltage reference for the sense amplifiers during cell read. This configuration allows an efficient use of the die area.

The operation of the n-sense amplifier is best described by way of an example. Referring to FIG. 11, assume an access of cell x was desired to read the contents of cell x 1003 and refresh cell x 1003 (due to the destructive nature of the read). Before transistor Qx is activated, the present n-sense amplifier will precharge lines D and D* to intermediate voltage DVC2 (midpoint between $V_{cc}$ and $V_{ss}$) via transistors Q4, Q5, Q6, and Q7. Transistors Q4 and Q6 are switching transistors to connect the reference voltage to D and D*. Transistors Q5 and Q7 are long channel transistors which are used as current limiters in the event that a defective cell attempts to ground the DVC2 source. Q5 and Q7 are "on" all of the time.

Cell x 1003 is connected to digit line D, therefore, after both D and D* are charged to voltage DVC2, transistor Qx will be switched on to connect capacitor Cx to D, and D* will be the reference at voltage DVC2. Since the capacitance of Cx is much less than the capacitance of D, the amount of charge on Cx will vary the voltage on D by a hundred millivolts or so. This voltage differential is sensed by cross-coupled transistor pair Q1 and Q2, which are activated when Q3 is activated (during a read operation of cell Cx). Q1 and Q2 will operate to drive D low if Cx is a logic zero on the read, and alternatively, will drive D* low if Cx is a logic one on the read. The p-sense amplifier discussed in the next section will be used to drive a digit line high if the cell contains a logic one, or alternatively drive the reference digit line high if the cell contains a logic zero.

Alternate embodiments of the n-sense amplifier contain an equilibrate transistor, Q8, which is switched on to equilibrate the voltages of the digit lines before a cell capacitor is connected to one of the digit lines.

The isolation circuit comprised of transistors Q9, Q10, Q11, and Q12 allows the n-sense amplifier to be shared between different memory cell arrays, as stated above. For example, Q9 and Q10 are switched on and Q11 and Q12 are switched off to allow the n-sense amplifier access to cells x and y, above. If Q9 and Q10 are switched off and Q11 and Q12 are switched on, then the n-sense amplifier is connected to another memory cell array, which includes cell q 1005. The sharing of the n-sense amplifiers is another space-saving technique which allows the present design to fit within a confined die size.

Figure 12:
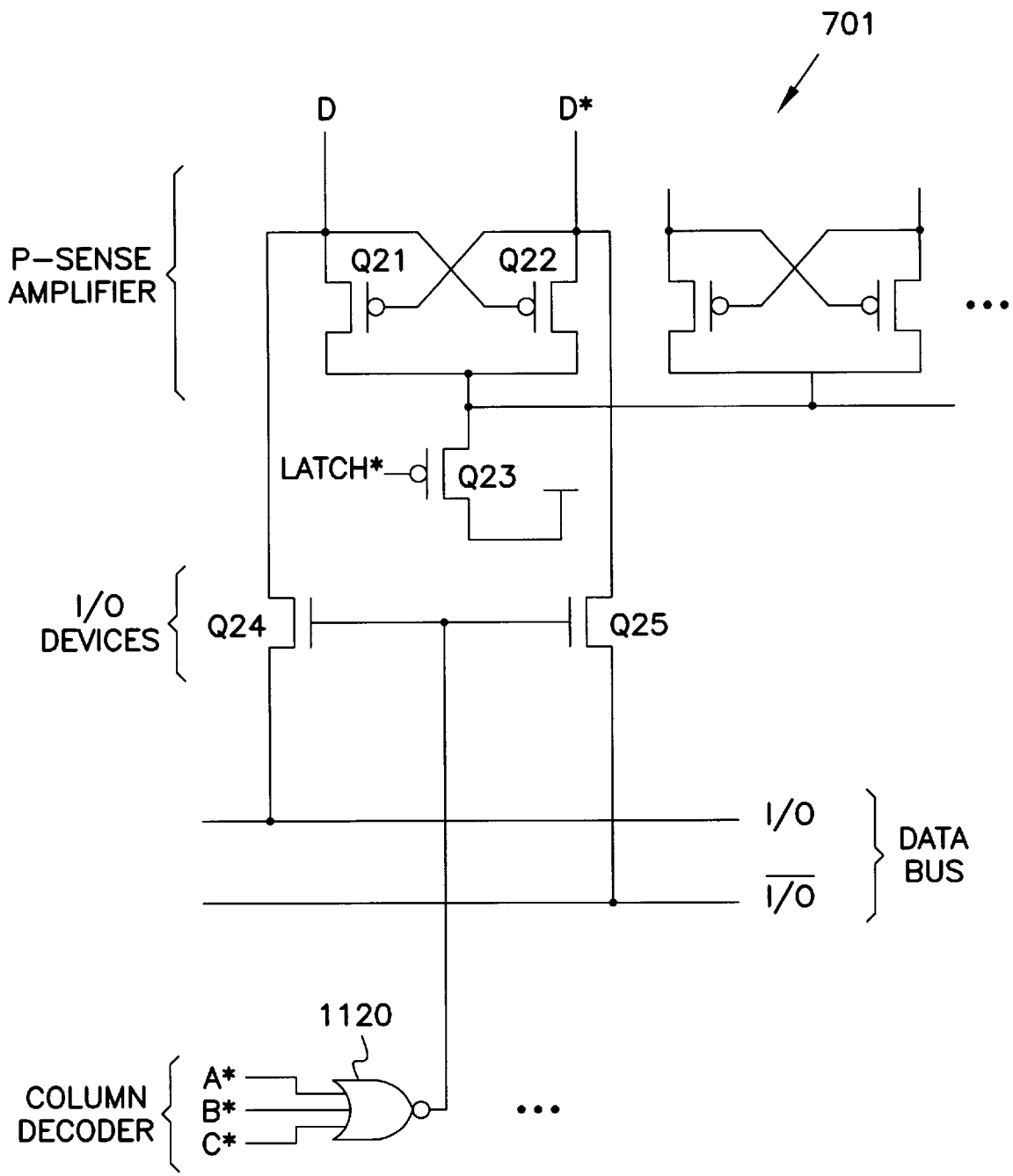
FIG. 12 is an electrical schematic diagram of the p-sense amplifiers, including input/output circuitry.

One configuration of a p-sense amplifier 701 is shown in FIG. 12. Operation of the p-sense amplifier is similar to that of the n-sense amplifier, however, normally Q23 is activated at close to the same time as Q3 and cross coupled transistors Q21 and Q22 operate to drive the higher digit line to logic one rather than logic zero.

The digit lines communicate with I/O device pitch cells which serve as isolation for outputs to the data bus. Column decoder logic 1120 is used to activate the appropriate I/O device to ensure one bit is driving the data bus.

Figure 13:
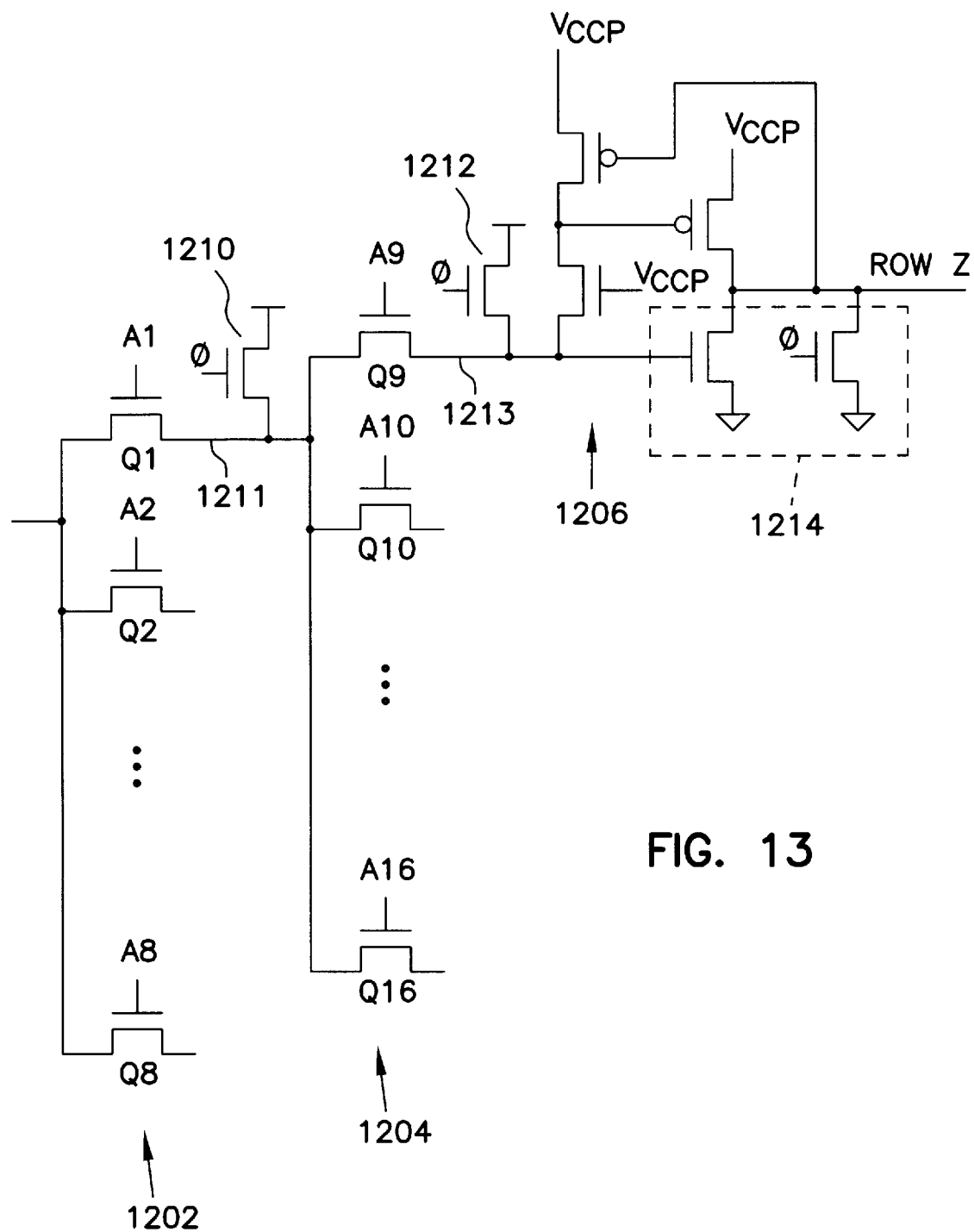
FIG. 13 is an electrical schematic diagram of the row decoder and row driver circuitry in one embodiment of the 16 megabit single deposition layer metal DRAM of FIG. 4.

One embodiment of a row-decoder/driver circuit is shown in FIG. 13. Conservation of row driver circuitry is obtained by increasing the number of columns (digit lines) driven by a single row driver circuit. The voltage necessary to drive a row-is boosted on the word line to allow a full-voltage "one" to be written into the cell capacitors. However, as the number of columns per row increases, the boost voltage must also be elevated to allow faster speed as the number of columns increase. Thus the row driver pitch cells are designed to be protected from the effects of punch through and other voltage elevation effects.

In the present row driver circuit, transistors Q1–Q16 of FIG. 13 are enhancement mode n-channel transistors. The signal input denoted by "φ"(herein "PHI") is both a decode and clock signal which is used to synchronize row activations of the memory cell array. When PHI goes low an entire bank of row decoders is selected. To select a row, one of A1–A8 would go high and then one of A9–A16 must go high. For example, if A1 goes high and A9 goes high, then row z is activated and goes high to activate the cell switches (FETs) per each memory cell of row z. This is accomplished by the PHI low (low active PHI) propagating through the first stage decode 1202 to second stage decode 1204 to the row driver 1206. Row driver 1206 includes an inverter circuit which inverts the PHI low to a high signal to drive the row z word line. The use of channel decoding transistors requires that each stage is gated per PHI individually. Transistors 1210 and 1212 separately control each stage voltage level to ensure that lines 1211 and 1213 are not floating, respectively. Bringing lines 1211 and 1213 to a high level in between PHI switching ensures that Q9 does not experience indeterminate switching due to an intermediate voltages on 1211 and 1213.

In order to place the row driver circuits on pitch with the memory cells, the row transistors 1214 are closely spaced and employ short channel devices to accommodate the placement of the driver cells on pitch with the memory cells. Reduction in both transistor spacing and in channel length increases the possibility of punch through and the leakage current of the transistors. These undesirable effects are reduced using an advanced transistor isolation system and by increasing the threshold voltages ("VT"s) of the transistors, as described below.

The proximity of row driver transistors enables placement of the row driver cells on pitch with the array of memory cells. This reduces necessity of using limited highly conductive interconnect real estate for off-pitch cell contacts, thereby freeing the single deposition layer metal for other interconnect purposes. Placing the row drivers on pitch also minimizes the necessity of using semiconductive interconnects, since most of the interconnects are non-overlapping and many can be accomplished using the single deposition layer metal. Therefore, placing the row driver cells on pitch with the memory cell array provides maximum cell array density using the available single deposition metal layer real estate with minimal semiconductive interconnects.

Reducing spacing between row driver transistors creates a parasitic transistor. This parasitic transistor must be controlled to prevent unwanted leakage current and punch through during operation of the row driver circuit. The leakage current and punch through problems are aggravated since the maximum voltages across the parasitic transistor channel are elevated above the supply voltage. Prevention of leakage current and punch through is achieved by p-doping the parasitic channel region under a field oxide insulator to increase the threshold voltage of the parasitic transistor. The p-type doping may be performed using ion implantation. A large field oxide overgrowth and a grounded parasitic gate structure provide enhanced punch through protection. In one embodiment of the present invention, the grounded gate is grounded using polysilicon strapped with titanium-silicide material.

Reduced channel length between the non-parasitic transistors also increases the leakage current through the channel regions of these transistors. The leakage current is reduced by p-doping the substrate regions under the gates of the n-channel transistors.

Figure 14:
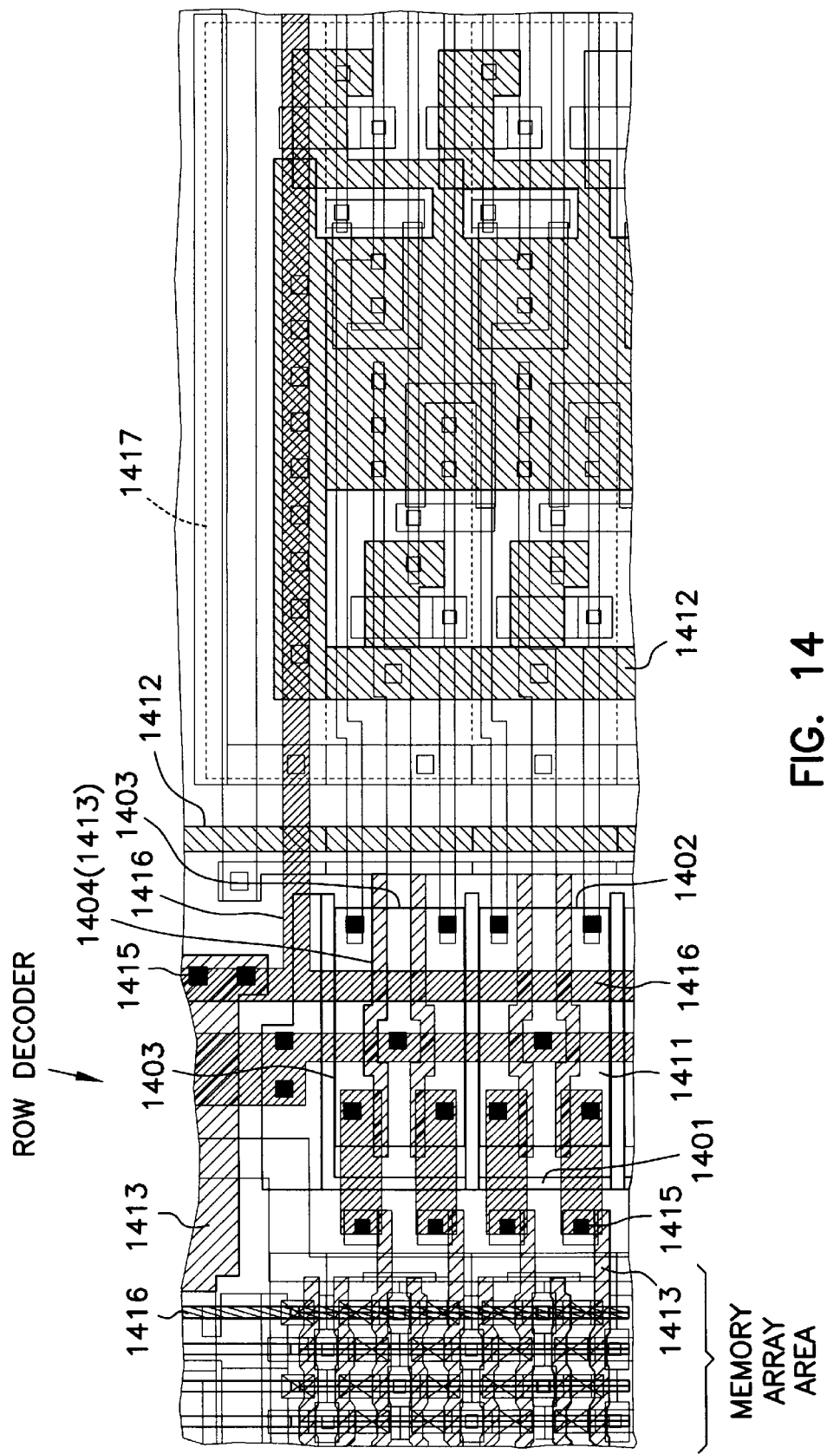
FIG. 14 is a layout diagram showing a portion of the row decoder pitch cell area and memory cell array area with the highly conductive interconnects and the semiconductor interconnects identified.

FIG. 14 is a layout diagram showing a portion of the row decoder pitch cell area and memory cell array area with the highly conductive interconnects and the semiconductor interconnects identified according to the key in Table 2 below. The grounded gate over field implant 1401 is shown in the layout diagram of FIG. 14 which serves to isolate drive transistors in area 1402 from adjacent transistors in area 1403 which corresponds to the drive transistors 1214 of FIG. 13. Implant 1404 serves to protect each transistor within area 1403 from punch through to the adjacent transistor.

TABLE 2

Figure 16:
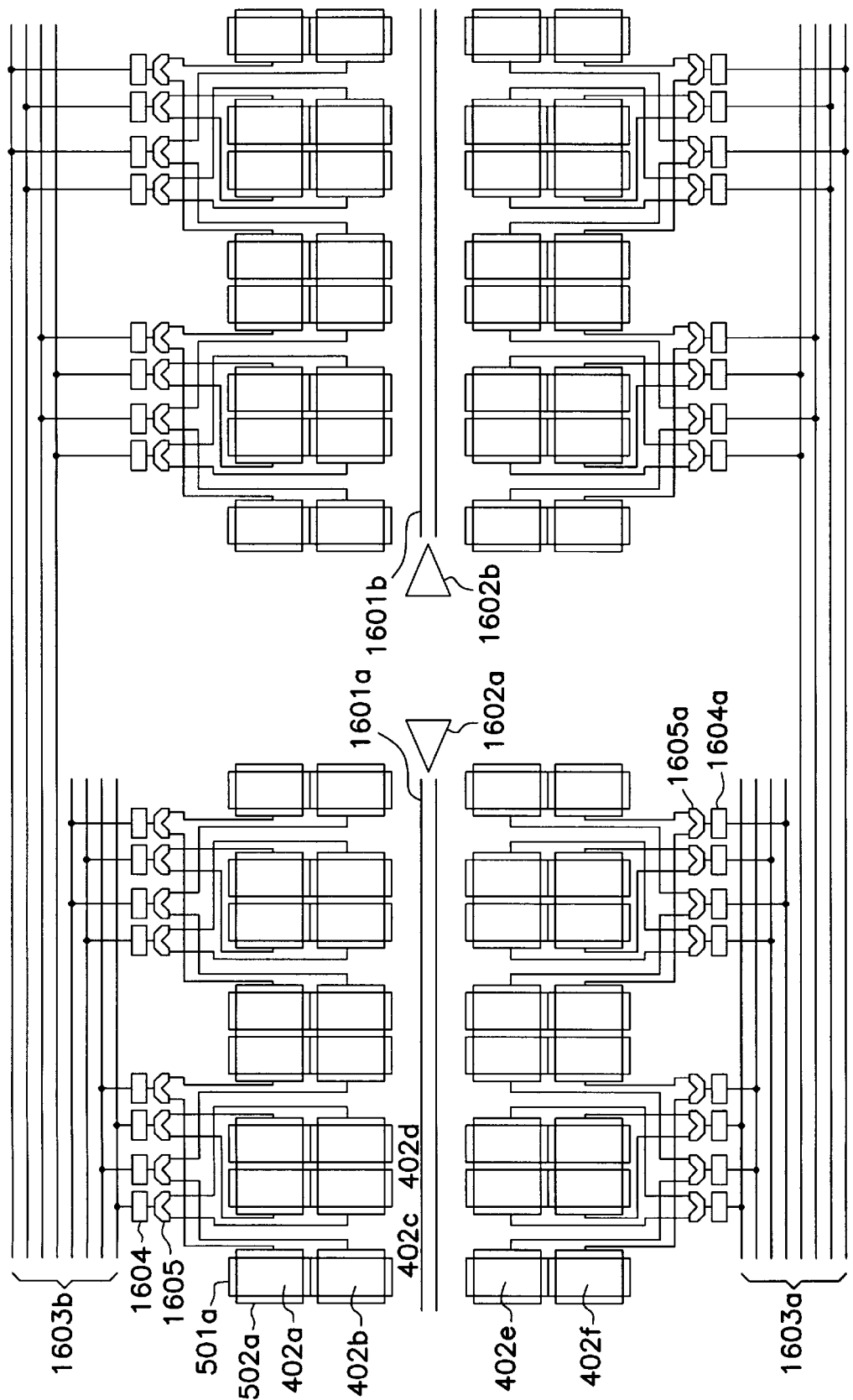
FIG. 16 is a detailed block diagram of the electrical interconnect of the address and data flow of the 16 megabit single deposition layer metal DRAM of FIG. 4.

| KEY TO LAYOUT FEATURES OF FIGS. 16 AND 17 | |
| --- | --- |
| MATERIAL | REFERENCE NUMBER |
| n+ diffusion | 1411 |
| p+ diffusion | 1412 |
| n polysilicon | 1413 |
| p polysilicon | 1414 |
| contact from diffusion or polysilicon to metal | 1415 |
| metal | 1416 |
| n-well boundary | 1417 |

Figure 15:
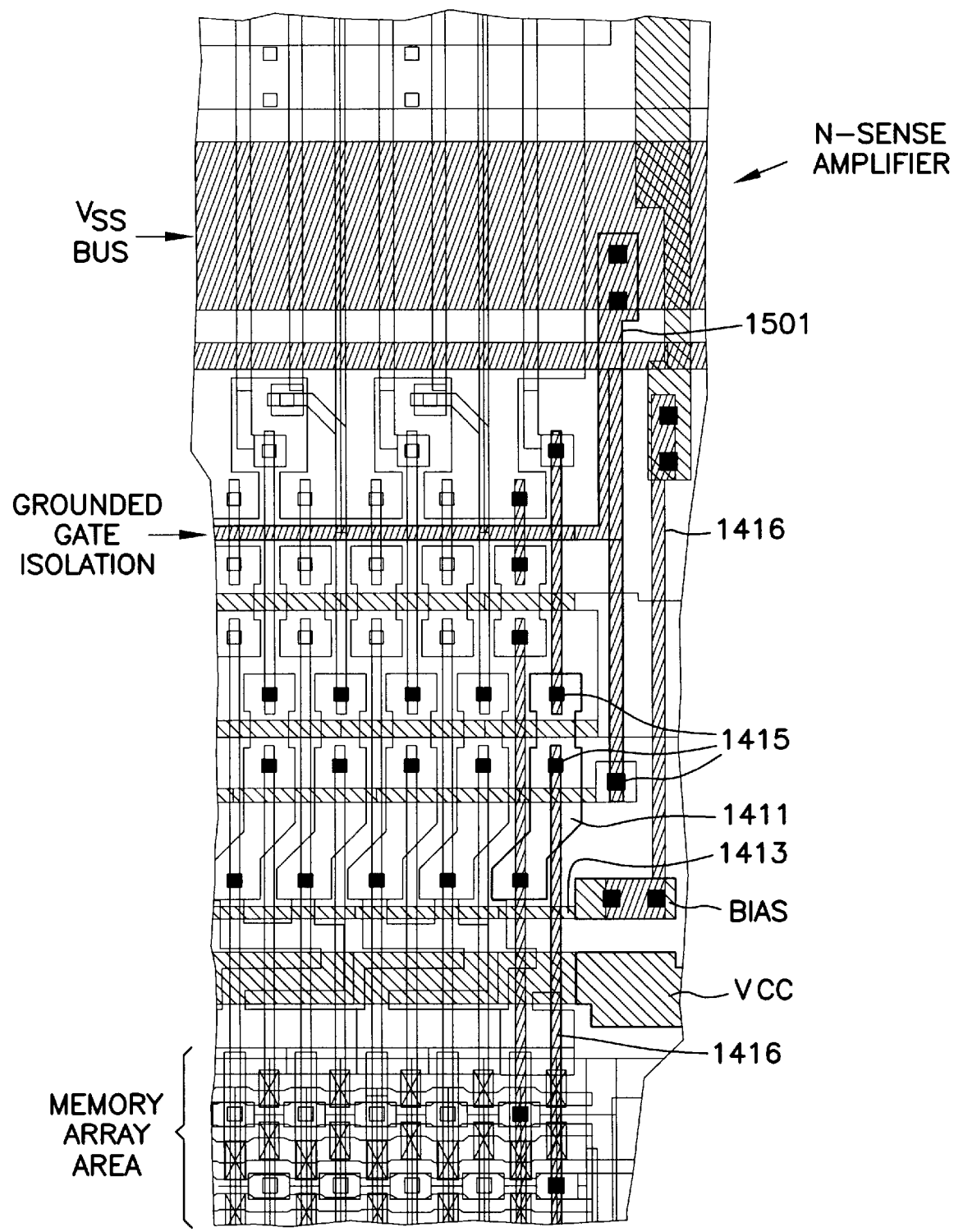
FIG. 15 is a layout diagram showing a portion of the n-sense amplifier pitch cell area and memory cell array area with the highly conductive interconnects and the semiconductor interconnects identified.

FIG. 15 is a layout diagram showing a portion of the n-sense amplifier pitch cell area and memory cell array area with the highly conductive interconnects and the semiconductor interconnects identified according to the key in Table 2 above. The memory array area is the same as that shown in FIG. 14. The metal bit lines 1416 connect the cells in the memory array to the n-sense amplifier which correspond to lines D and D* in FIG. 11. Grounded gate isolation is provided at 1501.

FIG. 16 is a detailed block diagram of the electrical interconnect of the address and data flow of the 16 megabit single deposition layer metal DRAM of FIG. 4. The entire memory array shown in electrical schematic form in FIG. 16 corresponds generally to the physical layout and architecture of FIG. 4. In the center of the array, address lines 1601 distribute the address signal to access a particular memory subarray, for example, subarray 402a. Each subarray contains 256 Kb of memory cells, as described above. The address lines 1601a and 1601b are driven by line drivers 1602a and 1602b, respectively.

While address distribution is done from the center of the die, the data paths are on the periphery of the die. The data lines from the array are selected through multiplexors 1605 and line drive circuits 1604. Data paths 1603a and 1603b are terminated at the line drivers connected to the data I/O pads of the die which are located, in the exemplary embodiment, to the left of the die shown in FIG. 16 since the data I/O pins are all placed on that side of the die. By overlaying FIG. 10 onto FIG. 16, one can see how the highly conductive power and ground distribution buses (implemented in metal in the exemplary embodiment) do not interfere with the address and data distribution, which is also done primarily in highly conductive interconnect such as metal.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A dynamic random access memory part, comprising:
    a package having an outline approximately 300 mils wide and 675 mils long and having a cavity;
    a semiconductor die sized to fit within the cavity in the package and further comprising:
        a plurality of memory cells having at least $2_{24}$ single-bit memory locations;
        a plurality of I/O bonding pads placed around the periphery of the die, a plurality of first power bonding pads placed around the periphery of the die, and a plurality of second power bonding pads placed in the interior of the die;
        a plurality of pitch cells fabricated to address, read and write the plurality of memory cells;
        a single deposition layer metal connecting portions of the memory cells, the I/O bonding pads, the first and second power bonding pads, and the pitch cells; and
        at least one polysilicon interconnect layer for connecting portions of the memory cells and the pitch cells; and
    a lead frame attached to the package and placed over the semiconductor die and wire bonded to electrically connect the lead frame to the plurality of I/O bonding pads and to the plurality of first and second power bonding pads.

2. The dynamic random access memory part according to claim 1, wherein the plurality of memory cells are divided into a plurality of memory subarrays.

3. The dynamic random access memory part according to claim 2, wherein each of the memory subarrays are arranged to have no more than $2^{18}$ memory cells.

4. The dynamic random access memory part according to claim 2, wherein bit lines connecting the memory cells of each of the memory subarrays are part of the single deposition layer metal.

5. The dynamic random access memory part according to claim 4, wherein word lines connecting the memory cells of each of the memory arrays are part of the polysilicon interconnect layer.

6. The dynamic random access memory part according to claim 5, wherein at least a portion of the polysilicon interconnect layer is strapped with silicide to improve conductivity.

7. The dynamic random access memory part according to claim 5, wherein at lease a portion of the polysilicon interconnect layer is strapped salicide (self-aligned silicide) to improve conductivity.

8. The dynamic random access memory part according to claim 5, wherein the pitch cells include row address decoders, column address decoders and sense amplifiers connected to the bit lines and the word lines.

9. The dynamic random access memory part according to claim 5, wherein the sense amplifiers comprise cross coupled pairs of transistors interconnected by at least a portion of the polysilicon interconnect layer in a balanced arrangement.

10. The dynamic random access memory part of claim 1 wherein the package conforms to the JEDEC R-PDSO-J standard for Small Outline J-wing (SOJ) packaging.

11. The dynamic random access memory part of claim 1 wherein the package conforms to the JEDEC R-PDSO-J standard for Thin, Small Outline Packaging (TSOP).

12. A dynamic random access memory part, comprising:
    an industry standard JEDEC package having an outline approximately 340 mils wide and approximately 670 mils long and having a centrally located interior cavity;
    the semiconductor die sized to fit within the interior cavity of the package and further comprising:
        a plurality of memory cells having at least $2^{24}$ single-bit addressable memory locations arranged as physical arrays, each of the physical arrays having no more than $2^{18}$ single-bit addressable memory locations;
        a plurality of signal bonding pads placed around the periphery of the die, a plurality of power bonding pads placed around the periphery of the die, and a plurality of power bonding pads placed in the interior of the die;
        no more than one metal interconnect layer fabricated for connecting portions of
            a.) the peripheral signal bonding pads to row address decoders and column address decoders;
            b.) bit lines connecting the plurality of the memory cells to sense amplifiers; and
            c.) the peripheral power bonding pads and interior power bonding pads on the semiconductor die to the row address decoders, the column address decoders and the sense amplifiers;
        at least one polysilicon interconnect layer for connecting portions of the memory cells, the signal bonding pads, the row address decoders, the column address decoders and the sense amplifiers; and
    a metal lead frame attached to the package and placed over the semiconductor die and wire bonded to electrically connect the lead frame to the peripheral signal bonding pads, to the peripheral power bonding pads and to the interior power bonding pads on the semiconductor die.

13. The dynamic random access memory part of claim 12 wherein the package conforms to the JEDEC R-PDSO-J standard for Small Outline J-wing (SOJ) packaging.

14. The dynamic random access memory part of claim 12 wherein the package conforms to the JEDEC R-PDSO-J standard for Thin, Small Outline Packaging (TSOP).

15. The dynamic random access memory part of claim 12 wherein the semiconductor die has a memory access time of 70 ns or less.

16. The dynamic random access memory part of claim 12 further comprising additional non-addressable spare memory locations.

17. A memory device, comprising:
    a lead assembly; and
    a die, comprising,
        at least 16 million memory cells;
            a first plurality of address lines, each line in contact with a first portion of said memory cells;
            a second plurality of address lines, each line in communication with a second portion of said memory cells, and a plurality of bondpads, said bondpads, said memory cells, and a selected one of said first and second plurality of address lines, each formed through an interconnect assembly consisting essentially of a single highly conductive layer on said die wherein the highly conductive layer has a sheet resistance of less than one ohm per square.

18. A memory comprising a semiconductor die having at least $2^{24}$ single-bit memory cells, the die including only a single deposition layer of highly conductive interconnect material formed by a method comprising the steps of:

forming a semiconductor die from a wafer having outer dimensions no greater than 300 mils wide by 500 mils long; the forming comprising;

fabricating at least $2^{24}$ memory cells on the semiconductor die and arranged as arrays, each of the arrays containing at least $2^{18}$ memory cells;

placing at least one polysilicon interconnect layer over the semiconductor die to form a plurality of word lines interconnecting the memory cells in the memory arrays;

depositing only a single deposition layer metal over the semiconductor die to form a plurality of bit lines interconnecting portions of the memory cells in the memory arrays;

singulating the die from the wafer;

inserting the semiconductor die into a cavity of an industry standard package having an outer dimension of approximately 340 mils wide by 675 mils long; and attaching a lead frame over the top of the cavity and over the top of the die and interconnecting power bus connections to the center of the die.

* * * * *